(12) United States Patent
Napierala

(10) Patent No.: US 7,498,662 B2
(45) Date of Patent: Mar. 3, 2009

(54) DIELECTRIC MEDIA INCLUDING SURFACE-TREATED METAL OXIDE PARTICLES

(75) Inventor: Mark E. Napierala, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 431 days.

(21) Appl. No.: 11/282,923

(22) Filed: Nov. 18, 2005

(65) Prior Publication Data

US 2007/0114516 A1    May 24, 2007

(51) Int. Cl.
    *H01L 23/58*      (2006.01)

(52) U.S. Cl. .............. 257/632; 257/642; 257/E21.207; 257/E51.001; 438/778; 438/780

(58) Field of Classification Search ............... 257/632, 257/642, E21.207, E51.001; 438/778, 780
See application file for complete search history.

(56) References Cited

U.S. PATENT DOCUMENTS

| | | | |
|---|---|---|---|
| 6,432,526 | B1 | 8/2002 | Arney et al. |
| 6,602,936 | B1 * | 8/2003 | Arnoux et al. ............... 523/457 |
| 6,689,468 | B2 * | 2/2004 | Edelmann et al. ........... 428/403 |
| 6,822,782 | B2 * | 11/2004 | Honeyman et al. .......... 359/296 |
| 6,905,906 | B2 * | 6/2005 | Sirringhaus et al. ........... 438/99 |
| 6,924,971 | B2 | 8/2005 | Satsu et al. |
| 2004/0180988 | A1 | 9/2004 | Bernius et al. |
| 2004/0222412 | A1 | 11/2004 | Bai et al. |
| 2005/0095448 | A1 | 5/2005 | Katz et al. |

FOREIGN PATENT DOCUMENTS

WO    WO 2004/104113 A1    12/2004

OTHER PUBLICATIONS

Maliakal, A, "Inorganic Oxide Core, Polymer Shell Nanocomposite as a High Gate *K* Gate Dielectric for Flexible Electronics Applications," Journal of the American Chemical Society, vol. 127, No. 42, (2005) pp. 14655-14662.
Lee, J.Y., "Electrophoretic Response of Poly(methyl methacrylate) Coated $TiO_2$ Nanoparticles." Synthetic Metals, vol. 153, (2005) pp. 221-224.
U.S. Appl. No. 11/026,573, "High Refractive Index, Durable Hard Coats", filed Dec. 30, 2004.

* cited by examiner

*Primary Examiner*—Asok K Sarkar
(74) *Attorney, Agent, or Firm*—John M. Bronk

(57) ABSTRACT

Briefly, the present invention provides an electronic device, typically a transistor or a capacitor, comprising at least one electrically conductive electrode and, adjacent to the electrode, a dielectric layer; wherein the dielectric layer comprises a polymeric matrix and, dispersed in the polymeric matrix, metal oxide particles; wherein the metal oxide particles have organic functional groups covalently bound to their surface, and wherein the organic functional groups are not covalently bound to the polymeric matrix. In another aspect, the present invention provides a printable dispersion, typically a jet-printable dispersion, comprising: a) a curable composition and b) metal oxide particles; wherein the metal oxide particles have organic functional groups covalently bound to their surface, and wherein the organic functional groups are not covalently bound to any part of the curable composition. In one embodiment, the organic functional groups do not react with any part of the curable composition to form covalent bonds. In one embodiment, the organic functional groups may react with the curable composition to form covalent bonds upon curing of the curable composition.

26 Claims, No Drawings

DIELECTRIC MEDIA INCLUDING SURFACE-TREATED METAL OXIDE PARTICLES

FIELD OF THE INVENTION

This invention relates to thin film electronic devices such as thin film transistors and capacitors and methods of making same, in particular by ink jet printing.

BACKGROUND OF THE INVENTION

US 2005/0095448 A1 purportedly discloses the use of core-shell particles to form dielectric layers.

SUMMARY OF THE INVENTION

Briefly, the present invention provides an electronic device, typically a transistor or a capacitor, comprising at least one electrically conductive electrode and, adjacent to the electrode, a dielectric layer; wherein the dielectric layer comprises a polymeric matrix and, dispersed in the polymeric matrix, metal oxide particles; wherein the metal oxide particles have organic functional groups covalently bound to their surface, and wherein the organic functional groups are not covalently bound to the polymeric matrix. The metal oxide particles typically include metals selected from the group consisting of: Ti, Y, Zr, Hf and Si, and most typically Ti. Typically the organic functional groups have a molecular weight of 1000 or less and are according to the formula:

$$(-O-)_x Q(-O-R^1)_y (-CH_2-R^2) \qquad (I)$$

where Q is Si or P=O; where each $R^1$ is independently selected from the group consisting of: hydrogen, alkyl, and substituted alkyl; where each $R^2$ is independently selected from the group consisting of: hydrogen, alkyl, substituted alkyl, alkoxy, substituted alkoxy; where, when Q is Si, x is 1-3, y is 0-2 and x+y=3; where, when Q is P=O, x is 1-2, y is 0-1 and x+y=2; and where the open oxygen valences are covalently bound to the surface of the metal oxide particles. Typically the polymeric matrix is a matrix of a polymer selected from the group consisting of: acrylates, methacrylates, epoxies, styrenes, fluoropolymers, vinyl alcohols and acetates. The polymeric matrix may be crosslinked.

In another aspect, the present invention provides a printable dispersion, typically a jet-printable dispersion, comprising: a) a curable composition and b) metal oxide particles; wherein the metal oxide particles have organic functional groups covalently bound to their surface, and wherein the organic functional groups are not covalently bound to any part of the curable composition. In one embodiment, the organic functional groups do not react with any part of the curable composition to form covalent bonds. In one embodiment, the organic functional groups may react with the curable composition to form covalent bonds upon curing of the curable composition. The metal oxide particles typically include metals selected from the group consisting of: Ti, Y, Zr, Hf and Si, and most typically Ti. Typically the organic functional groups have a molecular weight of 1000 or less and are according to the formula:

$$(-O-)_x Q(-O-R^1)_y (-CH_2-R^2) \qquad (I)$$

where Q is Si or P=O; where each $R^1$ is independently selected from the group consisting of: hydrogen, alkyl, and substituted alkyl; where each $R^2$ is independently selected from the group consisting of: hydrogen, alkyl, substituted alkyl, alkoxy, substituted alkoxy; where, when Q is Si, x is 1-3, y is 0-2 and x+y=3; where, when Q is P=O, x is 1-2, y is 0-1 and x+y=2; and where the open oxygen valences are covalently bound to the surface of the metal oxide particles. In an embodiment where the organic functional groups may react with the curable composition to form covalent bonds upon curing of the curable composition, each $R^1$ may be independently selected from the group consisting of: hydrogen, alkyl, substituted alkyl, reactively substituted alkyl, alkenyl, substituted alkenyl, reactively substituted alkenyl and each $R^2$ may be independently selected from the group consisting of: hydrogen, alkyl, substituted alkyl, reactively substituted alkyl, alkenyl, substituted alkenyl, reactively substituted alkenyl, alkoxy, substituted alkoxy, reactively substituted alkoxy. Typically the curable composition includes polymers, oligomers or monomers of polymers selected from the group consisting of: acrylates, methacrylates, epoxies, styrenes, fluoropolymers, vinyl alcohols and acetates. The curable composition may also include a crosslinking agent.

In another aspect, the present invention provides a method of making an electronic device comprising a dielectric which includes the step of ink jet printing a jet-printable dispersion according to the present invention.

In this application:

"printable dispersion" means a dispersion containing essentially no particles having an average radius of greater than 0.5 micrometer;

"jet-printable dispersion" means a dispersion containing essentially no particles having an average radius of greater than 0.2 micrometer;

"substituted" means, for a chemical species, substituted by conventional substituents which do not react to form covalent bonds with a polymeric matrix related therewith, e.g., substituents can be alkyl, alkoxy, polyethoxy, aryl, phenyl, halo (—F, —Cl, —Br or —I), hydroxy, etc.; where substituents themselves may be substituted where possible; and "reactively substituted" means, for a chemical species, substituted by conventional substituents which do react to form covalent bonds with a curable composition related therewith, upon curing of the curable composition.

It is an advantage of the present invention to provide readily manufacturable electronic devices and methods and dispersions for their manufacture.

DETAILED DESCRIPTION

In one aspect, the present invention provides an electronic device, typically a transistor or a capacitor, comprising at least one electrically conductive electrode and, adjacent to the electrode, a dielectric layer; wherein the dielectric layer comprises a polymeric matrix and, dispersed in the polymeric matrix, metal oxide particles; wherein the metal oxide particles have organic functional groups covalently bound to their surface, and wherein the organic functional groups are not covalently bound to the polymeric matrix.

Thin film transistors (TFT's) are FET's made with thin films containing organic semiconductor materials, such as pentacenes, or inorganic semiconductor materials, such as zinc oxides. In some embodiments, the thin layers may be applied to flexible substrates to provide flexible circuitry for various applications. In some applications, TFT technology is expected to demonstrate competitive advantages over conventional transistors such as low cost, low temperature processing and structural flexibility.

TFT's typically include a semiconductor in electrical contact with a source electrode and a drain electrode. The electrodes are made of electrically conductive materials, which may include carbon or metals such as copper, silver or gold. A dielectric material separates the semiconductor from a third electrode, the gate. The layers may be stacked in any suitable order. In some embodiments, the layers may be stacked in the order: substrate, gate electrode, gate dielectric, semiconductor, source and drain electrodes. In some embodiments, the layers may be stacked in the order: substrate, source and drain electrodes, semiconductor, gate dielectric, gate electrode. Other arrangements are possible.

Thin film circuits may include capacitors. As with conventional capacitors, a thin film capacitor includes a dielectric material interposed between two electrically conductive electrodes.

The electronic device according to the present invention comprises a dielectric layer adjacent to at least one electrically conductive electrode. The electronic device according to the present invention may be a TFT, a capacitor, a microphone, an antenna or any circuit element that includes a dielectric material. The circuit element may have any number of electrodes greater than zero. Typically, the electronic device according to the present invention is a TFT or a capacitor. The dielectric layer comprises a polymeric matrix and, dispersed in the polymeric matrix, metal oxide particles; where the metal oxide particles have organic functional groups covalently bound to their surface, and where the organic functional groups are not covalently bound to the polymeric matrix.

Any suitable metal oxide particles may be used in the practice of the present invention. Suitable metal oxide particles typically have a bulk dielectric constant of seven or more, more typically 10 or more, and more typically 15 or more. Suitable metal oxide particles may include transition metals. Suitable metal oxide particles may include metals of Groups IIA, IVA, VA and VIA, including, for the purpose of this application, Al, Si, Ga, Ge, As, Se, In, Sn, Sb, Te, Tl, Pb, Bi and Po. Suitable metal oxide particles may include metals selected from the group consisting of: Ti, Y, Zr, Hf and Si, and more typically include Ti. Suitable metal oxide particles may contain more than one metal element and may additionally contain non-metal elements beside oxygen. Suitable metal oxide particles include particles containing titanates such as $TiO_2$, $BaTiO_3$ and lead magnesium niobate-lead titanate. The particles typically have an average radius of no greater than 0.5 micrometer; more typically no greater than 0.2 micrometer.

Any suitable organic functional groups that will bind covalently to the surface of the metal oxide particles and not bind covalently to the polymeric matrix may be used in the practice of the present invention. Suitable organic functional groups typically have a molecular weight of 1000 or less. Typically the organic functional group falls under one of the general categories of silanes and phosphonic acids. Typically the organic functional group is a group according to the formula:

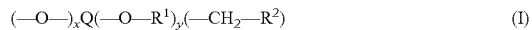

$$(-O-)_x Q(-O-R^1)_y (-CH_2-R^2) \quad (I)$$

where Q is Si or P=O; where each $R^1$ is independently selected from the group consisting of: hydrogen, alkyl, and substituted alkyl; where each $R^2$ is independently selected from the group consisting of: hydrogen, alkyl, substituted alkyl, alkoxy, substituted alkoxy; where, when Q is Si, x is 1-3, y is 0-2 and x+y=3; where, when Q is P=O, x is 1-2, y is 0-1 and x+y=2; and where the open oxygen valences are covalently bound to the surface of the metal oxide particles. The organic functional group will be bound to the surface of a metal oxide particle x times; that is, through each open oxygen valence. In some embodiments, Q is Si. In some embodiments, Q is P=O. In some embodiments, each $R^1$ is independently selected from the group consisting of methyl and ethyl. In some embodiments, Q is Si, each $R^1$ is independently selected from the group consisting of methyl and ethyl; and $R^2$ is $-CH_2-(O-CH_2-CH_2-)_z-OH$ where z is 1-19. In an embodiment where the organic functional groups may react with the curable composition to form covalent bonds upon curing of the curable composition, each $R^1$ may be independently selected from the group consisting of: hydrogen, alkyl, substituted alkyl, reactively substituted alkyl, alkenyl, substituted alkenyl, reactively substituted alkenyl and each $R^2$ may be independently selected from the group consisting of: hydrogen, alkyl, substituted alkyl, reactively substituted alkyl, alkenyl, substituted alkenyl, reactively substituted alkenyl, alkoxy, substituted alkoxy, reactively substituted alkoxy.

In the device according to the present invention, the polymeric matrix is a matrix of any suitable polymer that will not bind covalently to the organic functional groups bound to the metal oxide particles. Typical matrix polymers may be selected from the group consisting of: acrylates, methacrylates, epoxies, styrenes, fluoropolymers, vinyl alcohols and acetates. Most typically the matrix polymer is an acrylate. Typically the matrix polymer is crosslinked, but the matrix polymer may alternately be uncrosslinked.

The present invention also provides a printable dispersion useful in making thin film electronic devices, including electronic devices according to the present invention. The printable dispersion comprises: a) a curable composition; and b) metal oxide particles that have organic functional groups covalently bound to their surface. The metal oxide particles and organic functional groups are substantially as described above, except as noted following. In one embodiment, the organic functional groups are not covalently bound to any part of the curable composition and do not react with any part of the curable composition to form covalent bonds. In one embodiment, the organic functional groups are not covalently bound to any part of the curable composition but may react with the curable composition to form covalent bonds upon curing of the curable composition. In one embodiment of the present invention, the printable dispersion is a jet-printable dispersion.

In the dispersion according to the present invention, the curable composition is any suitable composition that may be cured to form the polymeric matrix of the present invention. Typical curable compositions include polymers, oligomers, monomers, or mixtures thereof. Typical curable compositions include polymers, oligomers, monomers, or mixtures thereof of polymers selected from the group consisting of: acrylates, methacrylates, epoxies, styrenes, fluoropolymers, vinyl alcohols and acetates. In some embodiments, the matrix polymer is an acrylate. In some embodiments, the matrix polymer is a polyvinylphenol (PVP) polymer. In some embodiments, the matrix polymer is a styrene-maleic anhydride copolymer such as the nitrile-containing styrene-maleic anhydride copolymer described in copending published application, U.S. 2004/0222412 A1. In some embodiments, the matrix polymer is a cyanomethyl styrene. Typically curable compositions include one or more crosslinking agents, but may alternately include no crosslinking agent.

The present invention also provides a method of making thin film electronic devices, including electronic devices according to the present invention, by applying the jet-printable dispersion according to the present invention by ink jet printing. The dispersion is typically applied to a substrate, which may an inorganic or organic substrate and may include glass, ceramic and/or polymeric materials. The dispersion may be applied to a flexible polymeric substrate. The dispersion is typically applied in a pattern determined according to the requirements of the circuit to be constructed. The pattern is not limited by the constraints placed on stencil-type patterns, e.g., the prohibition on isolated "islands."

This invention is useful in the manufacture of thin film electronic devices such as thin film transistors and capacitors.

Objects and advantages of this invention are further illustrated by the following examples, but the particular materials and amounts thereof recited in these examples, as well as other conditions and details, should not be construed to unduly limit this invention.

EXAMPLES

Unless otherwise noted, all reagents were obtained or are available from Aldrich Chemical Co., Milwaukee, Wis., or may be synthesized by known methods.

Preparatory Example A

Preparation of SiO$_2$/TiO$_2$ Nanoparticle Dispersion 214 g of a sol of silicate/titanate particles (available from Catalysts and Chemicals Ind. Co., Ltd, Kawasaki City, Kamagama, Japan as OPTOLAKE 3) was charged to a flask. The Optolake 3 was found by XRF to be 68.21% TiO$_2$, 23.7% SiO$_2$, 5.92% K$_2$O and some small amount of other elements. 7.5 g of SILQUEST A-1230 (available from GE Silicones, Wilton, Conn.), which is CH$_3$-endcapped polyethylene glycol trialkoxysilane, was added and the mixture was heated at 95° C. for 1 hour in an oven, after which time 2.67 g methyltriethoxysilane (available from Gelest Inc., Morrisville, Pa.) in 2.67 g 1-methoxy-2-propanol (DOWANOL-PM available from Aldrich, Milwaukee, Wis.) was added. The mixture was stirred at 95° C. overnight. The dispersion was adjusted to 15.3% solids by evaporating or adding 1-methoxy-2-propanol.

Preparatory Example B

Preparation of Polymer B

Polymer B is a nitrile-containing styrene-maleic anhydride copolymer that is described in U.S. Patent Publication No. 2004/0222412 A1, incorporated herein by reference. The synthesis is described therein at paragraphs 107 and 108 under the caption "Example 1, Synthesis of Polymer 1," as follows:

A 250-millilter (mL), three-necked flask fitted with magnetic stirrer and nitrogen inlet was charged with 8.32 grams (g) 3-methyl aminopropionitrile (Aldrich) and a solution of 20.00 g styrene-maleic anhydride copolymer (SMA 1000 resin available from Sartomer, Exton, Pa.) in 50 mL of anhydrous dimethylacrylamide (DMAc, Aldrich). After the mixture was stirred for 30 minutes (min) at room temperature, N, N-dimethylaminopyridine (DMAP) (0.18 g, 99%, Aldrich) was added and the solution was then heated at 110° C. for 17 hours (h). The solution was allowed to cool to room temperature and was slowly poured into 1.5 liters (L) of isopropanol while stirred mechanically. The yellow precipitate (Polymer B) that formed was collected by filtration and dried at 80° C. for 48 h at reduced pressure (approximately 30 millimeters (mm) Hg). Yield: 26.0 g.

Twenty grams (20 g) of this material (Polymer B) was dissolved in 50 mL anhydrous DMAc followed by the addition of 28.00 g glycidyl methacrylate (GMA) (Sartomer), 0.20 g hydroquinone (J. T. Baker, Phillipsburg, N.J.) and 0.5 g N, N-dimethylbenzylamine (Aldrich). The mixture was flashed with nitrogen and then was heated at 55° C. for 20 h. After the solution was allowed to cool to room temperature, it was poured slowly into 1.5 L of a mixture of hexane and isopropanol (2:1, volume:volume (v/v), GR, E. M. Science) with mechanical stirring. The precipitate that formed was dissolved in 50 mL acetone and precipitated twice, first into the same solvent mixture as used above and then using isopropanol. The solid (Polymer B) was collected by filtration and was dried at 50° C. for 24 h under reduced pressure. (approximately 30 mm Hg). Yield: 22.30 g. FT-IR (film): 3433, 2249, 1723, 1637, 1458, 1290, 1160, and 704 cm$^{-1}$. Mn (number average molecular weight)=8000 grams per mole (g/mol), Mw (weight average molecular weight)=22,000 g/mol. Tg=105° C.

Preparatory Example C

Preparation of Acrylic Acid 2-(naphthalen-2-ylsulfanyl)-ethyl ester (NSEA)

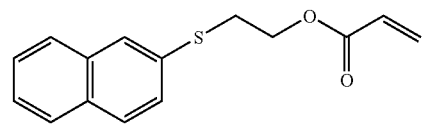

The synthesis of NSEA is disclosed in copending U.S. patent application Ser. No. 11/026,573, filed Dec. 30, 2004, incorporated herein by reference. The details are as follows:

A twelve liter three neck round bottom flask is equipped with a temperature probe, mechanical stirrer and condenser. 2000 g. 2-thionaphthol, 4000 g. toluene, and 63.1 g. triethylamine were added to the flask. Using medium agitation, the mixture was heated to 95° C. 1209 g. of melted ethylene carbonate was added dropwise to the reaction mixture. The reaction evolved CO$_2$. The addition took about three hours. At the conclusion of the addition, the reaction mixture was held at 95° C. for about twelve hours. The mixture was then cooled to room temperature and the solvent was stripped on a rotary evaporator to give the intermediate alcohol, which is a yellow oil that crystallizes upon standing. The yield was 1815 g. The melting point of this material was 61-63° C.

A 250 ml. three neck round bottom flask was equipped with a temperature probe, mechanical stirrer and condenser. 50 g. of the above intermediate alcohol was added to the flask along with 29.7 g. triethylamine, 0.01 grams each of salicylaldoxime and tetramethyl phenylenediamine and 430 g. of t-butylmethyl ether. The mixture was heated to 40° C. and 24.4 g. acryloyl chloride was added dropwise to the reaction. The reaction mixture was held at 40° C. for one hour. Then 400 grams water was added along with five grams concentrated HCl. After shaking the mixture the organic phase was separated and washed with a mixture of 300 grams water and 30 grams sodium carbonate. The organic phase was then washed with a mixture of 300 grams water and 30 grams sodium chloride. The solvent was removed on a rotary-evaporator to give acrylic acid 2-(naphthalene-2-ylsulfanyl)-ethyl ester (NSEA) which is a yellow oil. The yield was 50 g.

Preparatory Example D

Preparation of $ZrO_2$ Nanoparticle Dispersion

A $ZrO_2$ sol was made according to the procedures disclosed in U.S. Pat. No. 6,376,590. The $ZrO_2$ was found by XRF to be 79.27% $ZrO_2$, 13.34% $SiO_2$, 3.55% $HfO_2$, and 2.96% $Y_2O_3$. The $ZrO_2$ sol (300.41 g @ 36.16% $ZrO_2$) was charged to reaction vessel. 1-methoxy-2-propanol (302 g), SILQUEST A-174 (available from GE Silicones, Wilton, Conn.), (37.57 g) and Prostab 5190 (Ciba) (0.27 g @ 5.3 wt %) were charged, in that order, with stirring. The mixture was heated to 90° C. for 4 hr15 min. A 2 liter beaker was charged with D.I. water (1400 g) and concentrated ammonia (33 g). The above reaction mixture was added to the aqueous ammonia with minimal stirring. A white precipitate was formed and allowed to stand for about 10 min. The precipitate was isolated via vacuum filtration (Whatmann filter paper No. 1). The damp solids were dispersed in 1-methoxy-2-propanol (700 g) to obtain a translucent mixture. The mixture (904 g) was concentrated to 369 g. 1-methoxy-2-propanol (311 g) was added and the mixture concentrated to 273 g. 1-methoxy-2-propanol (403 g) was added and the mixture concentrated to 258 g. 1-methoxy-2-propanol (72 g) was added to obtain the final mixture. The solids content was 37.1 wt %, determined gravimetrically.

Example 1

6 g of a 9.7 wt % solution of Polymer B in 1-methoxy-2-propanol (Dowanol PM, Aldrich), 3.8 g of the silicate/titanate nanoparticle solution from Preparatory Example A, 0.1 g of silicone polyether acrylate (TegoRad 2250, Goldschmidt Chemical Corp., Hopewell, Va.), 0.078 g of 2-, 4-, 6-trimethylbenzoyl-diphenyl-phosphineoxide (TPOL, Ciba, Basel, Switzerland), and 0.05 g of pentaerythritol tetraacrylate (SR444, Sartomer, Exton, Pa.) were added to a vile. This sample was stirred until homogeneous, and then filtered through a 0.2 micrometer filter.

Example 2

6 g of a 9.7 wt % solution of Polymer B in 1-methoxy-2-propanol (Dowanol PM, Aldrich), 8.876 g of the silicate/titanate nanoparticle solution from Preparatory Example A, 0.1 g of silicone polyether acrylate (TegoRad 2250, Goldschmidt Chemical Corp.), and 0.081 g of 2-, 4-, 6-trimethylbenzoyl-diphenyl-phosphineoxide (TPOL, Ciba) were added to a vial. This sample was stirred until homogeneous and then filtered through a 0.2 micrometer filter.

Comparative Example 2C (Comparative of Example 2)

20 g of a 10 wt % solution of Polymer B in 1-methoxy-2-propanol (Dowanol PM, Aldrich), 0.195 g of silicone polyether acrylate (TegoRad 2250, Goldschmidt Chemical Corp.), and 0.2 g of 2-, 4-, 6-trimethylbenzoyl-diphenyl-phosphineoxide (TPOL, Ciba) were added to a vial. This sample was stirred until homogeneous and then filtered through a 0.2 micrometer filter.

Example 3

6 g of DI water, 3 g of 1-methoxy-2-propanol (Dowanol PM, Aldrich), and 5.25 g of poly(ethyleneglycol(600)diacrylate) (SR610, Sartomer) were added to a vial. This mixture was stirred until the solution became homogeneous. Then 0.75 g of titania ($nTiO_2$ available from Buhler, Uzivil, Switzerland) were added and the mixture was shear mixed for 1 minute using a handheld shear mixer. 0.15 g of silicone polyether acrylate (TegoRad 2250, Goldschmidt Chemical Corp.) and 0.05 g of 2-, 4-, 6-trimethylbenzoyl-diphenyl-phosphineoxide (TPOL, Ciba) were then added and the mixture was shear mixed for another 30 seconds. It was allowed to stand and then filtered through a 0.45 micrometer filter.

Example 4

0.25 g of poly(alpha-methylstyrene) (AMS $M_n$=126,000, $M_w$=133,600, PDI=1.06, Polymer Source, Dorval, QE, Canada), 4.75 g of cyclohexanone (Lancaster Synthesis, Inc.), and 1.63 g of the silicate/titanate nanoparticle solution from Preparatory Example A were added to a vial. The sample was stirred at 50° C. until the AMS had dissolved, then was filtered through a 0.45 micrometer filter.

Comparative Example 4C (Comparative of Example 4)

0.25 g of poly(alpha-methylstyrene) (AMS $M_n$=126,000, $M_w$=133,600, PDI=1.06, Polymer Source) and 4.75 g of cyclohexanone (Lancaster Synthesis, Inc.) were added to a vial. The sample was stirred at 50° C. until AMS had dissolved, then filtered through a 0.45 micrometer filter.

Example 5

2 g of a 40 wt % solids crosslinking agent in toluene, the solids being 20 wt % 9, 9-bis(3-chloro-4-aminophenyl)fluorine (prepared as described in U.S. Pat. No. 4,684,678), 64 wt % Epon 1001F epoxy (Resolution Performance Products), 16 wt % Epon 1050 epoxy (Resolution Performance Products), 0.4 wt % 5-aminobenzotriazole (Lancaster Synthesis, Inc).) and 0.59 g of the silicate/titanate nanoparticle solution from Preparatory Example A were placed in a vile. This mixture was stirred until homogeneous and then filtered through a 0.45 micrometer filter.

Comparative Example 5C (Comparative of Example 5)

2 g of a 40 wt % solids crosslinking agent in toluene, the solids being 20 wt % 9, 9-bis(3-chloro-4-aminophenyl)fluorine (prepared as described in U.S. Pat. No. 4,684,678), 64 wt % Epon 1001F epoxy (Resolution Performance Products), 16 wt % Epon 1050 epoxy (resolution Performance Products), 0.4 wt % 5-aminobenzotriazole (Lancaster Synthesis, Inc).) and 2 g of 1-methoxy-2-propanol (Dowanol PM, Aldrich) were placed in a vile. This was stirred until homogeneous and then filtered through a 0.45 micrometer filter.

Example 6

2 g of a 40 wt % solids crosslinking agent in toluene, the solids being 20 wt % 9, 9-bis(3-chloro-4-aminophenyl)fluorine (prepared as described in U.S. Pat. No. 4,684), 678, 64 wt % Epon 1001F epoxy (Resolution Performance Products), 16 wt % Epon 1050 epoxy (Resolution Performance Products), 0.4 wt % 5-aminobenzotriazole (Lancaster Synthesis, Inc), and 5.2 g of the silicate/titanate nanoparticle solution from Preparatory Example A were placed in a vial. The contents were stirred until homogeneous and then filtered through a 0.45 micrometer filter.

Example 7

0.52 g of poly-4-vinylphenol (Aldrich, Mw=20,000), 9.5 g of cyclohexanone (Lancaster Synthesis, Inc.), 3.43 g of the silicate/titanate nanoparticle solution from Preparatory Example A, and 0.015 g of poly(melamine-co-formaldehyde) (Aldrich) were added to a vile. The mixture was stirred until homogeneous and filtered through a 0.45 micrometer filter.

Comparative Example 7C (Comparative of Example 7)

0.5 g of poly-4-vinylphenol (Aldrich, Mw=20,000), 9.5 g of cyclohexanone (Lancaster Synthesis, Inc.), and 0.015 g of poly(melamine-co-formaldehyde) (Aldrich) were added to a vial. This mixture was stirred until homogeneous and filtered through a 0.45 micrometer filter.

Example 8

9 g of NSEA, 1 g of pentaerythritol tetraacrylate (SR444, Sartomer), 10.41 g of the $ZrO_2$ from Prep Example D and 0.015 g of 2-, 4-, 6-trimethylbenzoyl-diphenyl-phosphineoxide (TPOL, Ciba) were added to a vial. The sample was mixed until homogeneous and then filtered through a 0.45 micrometer filter.

Comparative Example 8C (Comparative of Example 8)

9 g of NSEA, 1 g of pentaerythritol tetraacrylate (SR444, Sartomer), and 0.015 g of 2-, 4-, 6-trimethylbenzoyl-diphenyl-phosphineoxide (TPOL, Ciba) were added to a vial. The sample was mixed until homogeneous and then filtered through a 0.45 micrometer filter.

Preparation of Capacitors

All capacitors were made in a similar manner. 5 Angstroms of Ti (Alfa Aesar) was sputtered onto the surface of a 5.08 cm by 5.08 cm glass slide (Precision Glass), followed by 600 Angstroms of Au (Williams Advanced Materials). The Au surface was cleaned sequentially with acetone (J T Baker), IPA (J T Baker), and a DI water wash and then blown dry. 1-2 mL of the dielectric solution to be tested was placed on the Au surface, completely covering the Au. The glass slide was spun at a rate between 4000-6100 RPM for 40-60 seconds and then treated as follows. In the case Examples 1, 2, 2C and 3 the slide was heated at 120° C. for 5 minutes, then exposed to 4.96 J/cm² UV energy for crosslinking. In the case of Examples 8 and 8C the slide was exposed to 4.96 J/cm² UV energy for crosslinking. In the case of Examples 4, 4C, 7 and 7C, the slide was baked for 5 minutes at 100° C. followed by 5 minutes at 200° C. In the case of Examples 5, 5C, and 6, the slide was baked for 2 hours at 190° C. Once the dielectric was dried and cured, a patterned mask was placed on top and 600 Angstroms of Au (Williams Advanced Materials) was deposited to produce a top contact. Measurements taken of the resulting capacitors are reported in Table I.

TABLE I

| Ex. | Wt % Inorganic | Vol % Inorganic | Dielectric Layer Thickness (nm) | Electric Permittivity @ 10 kHz | Electric Permittivity @ 100 kHz |
|---|---|---|---|---|---|
| 1 | 50% $TiO_2/SiO_2$ | 23.1 | 640 | 6.9 | 6.5 |
| 2 | 70% $TiO_2/SiO_2$ | 29.7 | 700 | 8.6 | 7.9 |
| 2C | 0 | 0 | 640 | 4.6 | 4.5 |
| 3 | 12.5% $TiO_2$ | 3.5 | 2800 | 14.9 | 10.8 |
| 4 | 50% $TiO_2/SiO_2$ | 24.6 | 480 | 7 | 6.5 |
| 4C | 0 | 0 | 270 | 3.1 | 3.1 |
| 5 | 10% $TiO_2/SiO_2$ | 3.6 | 3500 | 4 | 3.6 |
| 5C | 0 | 0 | 1300 | 3.5 | 3.5 |
| 6 | 50% $TiO_2/SiO_2$ | 24.9 | 1340 | 5.9 | 5.6 |
| 7 | 50% $TiO_2/SiO_2$ | 27.5 | 250 | 8.2 | 8 |
| 7C | 0 | 0 | 260 | 4.1 | 3.8 |
| 8 | 51% $ZrO_2$ | 17.3 | 2800 | 6.3 | 6.3 |
| 8C | 0 | 0 | 1280 | 3.8 | 3.8 |

Table I indicates that higher electric permittivity was obtained using the compositions of the present invention in comparison with similar comparative compositions. It will be appreciated that increased loadings of inorganic particles typically lead to greater dielectric constants.

Various modifications and alterations of this invention will become apparent to those skilled in the art without departing from the scope and principles of this invention, and it should be understood that this invention is not to be unduly limited to the illustrative embodiments set forth hereinabove.

I claim:

1. An electronic device comprising at least one electrically conductive electrode and, adjacent to the electrode, a dielectric layer; wherein the dielectric layer comprises a polymeric matrix and, dispersed in the polymeric matrix, non-associated metal oxide particles having an average radius no greater than 0.5 micrometers; wherein the non-associated metal oxide particles have organic functional groups covalently bound to their surface, and wherein the organic functional groups are not covalently bound to the polymeric matrix.

2. The electronic device according to claim 1 wherein the non-associated metal oxide particles include metals selected from the group consisting of: Ti, Y, Zr, Hf and Si.

3. The electronic device according to claim 1 wherein the non-associated metal oxide particles include Ti.

4. The electronic device according to claim 1 wherein the organic functional groups have a molecular weight of 1000 or less and are according to the formula:

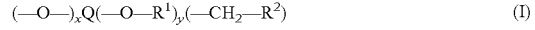

$$(-O-)_x Q(-O-R^1)_y (-CH_2-R^2) \quad (I)$$

where Q is Si or P=O;
where each $R^1$ is independently selected from the group consisting of: hydrogen, alkyl, and substituted alkyl;
where each $R^2$ is independently selected from the group consisting of: hydrogen, alkyl, substituted alkyl, alkoxy, substituted alkoxy;
where, when Q is Si, x is 1-3, y is 0-2 and x+y=3;
where, when Q is P=O, x is 1-2, y is 0-1 and x+y=2; and
where the open oxygen valences are covalently bound to the surface of the non-associated metal oxide particles.

5. The electronic device according to claim 4 where Q is Si.

6. The electronic device according to claim 5 where:
each $R^1$ is independently selected from the group consisting of methyl and ethyl; and $R^2$ is —$CH_2$—(—O—$CH_2$—$CH_2$—)$_z$—$OCH_3$ where z is 1-19.

7. The electronic device according to claim 4 where Q is P=O.

8. The electronic device according to claim 1 wherein the polymeric matrix is a matrix of a polymer selected from the group consisting of: acrylates, methacrylates, epoxies, styrenes, fluoropolymers, vinyl alcohols and acetates.

9. The electronic device according to claim 1 wherein the polymeric matrix is crosslinked.

10. The electronic device according to claim 1 wherein the electronic device is a transistor.

11. The electronic device according to claim 1 wherein the electronic device is a capacitor.

12. A printable dispersion comprising:
a) a curable composition; and
b) metal oxide particles;
the metal oxide particles having organic functional groups covalently bound to their surface, the organic functional groups having a molecular weight of 1000 or less and are according to the formula:

$$(-O-)_x Q(-O-R^1)_y (-CH_2-R^2) \qquad (I)$$

where Q is P=O;
where each $R^1$ is independently selected from the group consisting of: hydrogen, alkyl, and substituted alkyl;
where each $R^2$ is independently selected from the group consisting of: hydrogen, alkyl, substituted alkyl, alkoxy, substituted alkoxy;
where x is 1-2, y is 0-1 and x+y=2 and
where the open oxygen valences are covalently bound to the surface of the metal oxide particles, and wherein the organic functional groups are not covalently bound to any part of the curable composition.

13. The printable dispersion according to claim 12 which is a jet-printable dispersion.

14. The printable dispersion according to claim 13 wherein the metal oxide particles include metals selected from the group consisting of: Ti, Y, Zr, Hf and Si.

15. The printable dispersion according to claim 13 wherein the metal oxide particles include Ti.

16. A method of making an electronic device comprising a dielectric which includes the step of ink jet printing a jet-printable dispersion according to claim 15.

17. The printable dispersion according to claim 13 wherein the organic functional groups have a molecular weight of 1000 or less and are according to the formula:

$$(-O-)_x Q(-O-R^1)_y (-CH_2-R^2) \qquad (I)$$

where Q is P=O;
where each $R^1$ is independently selected from the group consisting of: hydrogen, alkyl, substituted alkyl, reactively substituted alkyl, alkenyl, substituted alkenyl, reactively substituted alkenyl;
where each $R^2$ is independently selected from the group consisting of: hydrogen, alkyl, substituted alkyl, reactively substituted alkyl, alkenyl, substituted alkenyl, reactively substituted alkenyl, alkoxy, substituted alkoxy, reactively substituted alkoxy;
where x is 1-2, y is 0-1 and x+y=2; and
where the open oxygen valences are covalently bound to the surface of the metal oxide particles.

18. A method of making an electronic device comprising a dielectric which includes the step of ink jet printing a jet-printable dispersion according to claim 17.

19. The printable dispersion according to claim 13 wherein the curable composition includes a polymer selected from the group consisting of: acrylates, methacrylates, epoxies, styrenes, fluoropolymers, vinyl alcohols and acetates.

20. The printable dispersion according to claim 13 wherein the curable composition includes monomers of a polymer selected from the group consisting of: acrylates, methacrylates, epoxies, styrenes, fluoropolymers, vinyl alcohols and acetates.

21. The printable dispersion according to claim 13 wherein the curable composition includes a crosslinking agent.

22. A method of making an electronic device comprising a dielectric which includes the step of ink jet printing a jet-printable dispersion according to claim 21.

23. A method of making an electronic device comprising a dielectric which includes the step of ink jet printing a jet-printable dispersion according to claim 13.

24. A method of making an electronic device comprising a dielectric which includes the step of ink jet printing a jet-printable dispersion according to claim 13.

25. The printable dispersion according to claim 12 wherein the organic functional groups are not covalently bound to any part of the curable composition and do not react with any part of the curable composition to form covalent bonds.

26. The printable dispersion according to claim 12 wherein the organic functional groups are not covalently bound to any part of the curable composition but may react with the curable composition to form covalent bonds upon curing of the curable composition.

* * * * *

UNITED STATES PATENT AND TRADEMARK OFFICE
CERTIFICATE OF CORRECTION

| | |
|---|---|
| PATENT NO. | : 7,498,662 B2 |
| APPLICATION NO. | : 11/282923 |
| DATED | : March 3, 2009 |
| INVENTOR(S) | : Mark E. Napierala |

It is certified that error appears in the above-identified patent and that said Letters Patent is hereby corrected as shown below:

<u>Column 6</u>
Line 63, delete "HCI." and insert -- HC1. -- in place thereof.

<u>Column 11</u>
Line 27, Claim 12, delete "2 and" and insert -- 2; and -- in place thereof.

Signed and Sealed this

Nineteenth Day of May, 2009

JOHN DOLL
*Acting Director of the United States Patent and Trademark Office*